United States Patent
Hosoda et al.

(10) Patent No.: US 8,410,745 B2
(45) Date of Patent: Apr. 2, 2013

(54) CONTROLLER FOR MOTOR, AND VEHICLE

(75) Inventors: Masaharu Hosoda, Wako (JP); Yuji Saito, Wako (JP); Yasuyuki Danjo, Wako (JP); Hideki Inoue, Wako (JP); Tetsu Sugiyama, Wako (JP); Junji Kato, Wako (JP)

(73) Assignee: Honda Motor Co., Ltd., Tokyo (JP)

( * ) Notice: Subject to any disclaimer, the term of this patent is extended or adjusted under 35 U.S.C. 154(b) by 879 days.

(21) Appl. No.: 12/528,908

(22) PCT Filed: Feb. 18, 2008

(86) PCT No.: PCT/JP2008/052661
§ 371 (c)(1),
(2), (4) Date: Aug. 27, 2009

(87) PCT Pub. No.: WO2008/108159
PCT Pub. Date: Sep. 12, 2008

(65) Prior Publication Data
US 2010/0036555 A1    Feb. 11, 2010

(30) Foreign Application Priority Data
Mar. 5, 2007   (JP) .................................. 2007-054011

(51) Int. Cl.
*H02P 27/04* (2006.01)
(52) U.S. Cl. .............. 318/801; 361/1; 361/100; 363/40; 363/56.01; 363/95; 318/800
(58) Field of Classification Search .................. 318/800, 318/801, 400.01, 432, 434, 515, 516, 701, 318/727, 528; 363/40, 55, 56.01, 56.04, 363/56.07, 56.1, 95; 290/40 C; 701/22; 361/1, 31, 100
See application file for complete search history.

(56) References Cited

U.S. PATENT DOCUMENTS

| | | | | |
|---|---|---|---|---|
| 6,369,543 | B1 * | 4/2002 | Masselus et al. | 318/700 |
| 6,741,116 | B2 * | 5/2004 | Herzer et al. | 327/434 |
| 7,110,272 | B2 * | 9/2006 | Nojima | 363/56.03 |
| 7,339,803 | B2 * | 3/2008 | Nojima | 363/37 |
| 7,471,003 | B2 * | 12/2008 | Kobayashi et al. | 290/40 C |
| 7,626,838 | B2 * | 12/2009 | Gunji | 363/56.04 |
| 8,045,301 | B2 * | 10/2011 | Shiba et al. | 361/23 |
| 2009/0195199 | A1 * | 8/2009 | Ito | 318/400.22 |

FOREIGN PATENT DOCUMENTS

DE      102 05 963 A1    9/2003
DE  10 2006 003 254 A1    7/2007

(Continued)

*Primary Examiner* — Antony M Paul
(74) *Attorney, Agent, or Firm* — Arent Fox LLP

(57) ABSTRACT

When a short-circuit failure of any of switch portions (13) including switch elements (11) and parallel-connected feedback diodes (12) of an inverter circuit (7) is detected during the operation of a motor (1), a switch portion (13) where the short-circuit failure has occurred is checked for whether it is on the positive polarity side or the negative polarity side. The switch elements (11) are so controlled that all the switch portions (13) on the same polarity side as where the short-circuit has occurred are brought into a conducted state and all the others are disconnected. This prevents a large electric current from flowing into each switch portion of the inverter circuit without requiring any switch to block the power distribution between a motor and the inverter circuit when a short-circuit failure of the switch portion of the inverter circuit occurs.

6 Claims, 6 Drawing Sheets

FOREIGN PATENT DOCUMENTS

| | | |
|---|---|---|
| GB | 2 309 597 A | 7/1997 |
| JP | 57-183274 A | 11/1982 |
| JP | 5-199607 A | 8/1993 |
| JP | 07-059384 A | 3/1995 |
| JP | 09-046811 A | 2/1997 |
| JP | 2002-502219 A | 1/2002 |
| JP | 2004-040921 A | 2/2004 |
| JP | 2006-158182 A | 6/2006 |
| JP | 2007-312588 A | 11/2007 |
| WO | WO-2007/085566 A1 | 8/2007 |

\* cited by examiner

CONTROLLER FOR MOTOR, AND VEHICLE

CROSS-REFERENCE TO RELATED APPLICATION

This application is a National Stage entry of International Application No. PCT/JP2008/052661, filed Feb. 18, 2008, which claims priority to Japanese Patent Application 2007-054011, filed on Mar. 5, 2007, the disclosure of the prior application being incorporated in its entirety by reference.

BACKGROUND OF THE INVENTION

1. Field of the Invention

The present invention relates to a controller for a motor used as a driving force generation element or the like for a vehicle, and a vehicle mounted with the motor.

2. Description of the Related Art

Generally, a motor having an armature of multiple phases, such as a brushless direct-current motor of three phases, is mounted in a vehicle such as a hybrid vehicle or an electric vehicle and is used as a driving force generation element for the vehicle. The operation control of the motor is generally performed by supplying electric power from a capacitor such as a battery or the like through the intermediary of an inverter (PWM inverter) circuit of multiple phases to the motor (for example, refer to Japanese Patent Laid-open No. H9-46811).

In general, the inverter circuit designated by a reference number 7 has a circuit configuration illustrated in FIG. 1, for example. As illustrated, the inverter circuit 7 is constituted by connecting in parallel arms 10u, 10v and 10w of multiple phases (3 phases in the illustrated example). Each of the arms 10u, 10v and 10w is constituted by connecting in series a switch portion 13a disposed on a positive polarity side and a switch portion 13b disposed on a negative polarity side. The switch portion 13a is constituted by connecting a switch element 11a and a feedback diode 12a in parallel. The switch portion 13b is constituted by connecting a switch element 11b and a feedback diode 12b in parallel.

When the motor is in operation, a short-circuit failure may occur in either switch portion of the inverter circuit so that the switch portion is kept in a continual conducted state despite a control signal output to a switch element of the switch portion. The conducted state of a switch portion described in the present invention means that both terminals of the switch portion are substantially short-circuited and an electric current can flow in the switch portion in both directions. When a switch element and a feedback diode of a switch portion are functioning normally, the conducted state of the switch portion is equivalent to the conducted state (ON state) of the switch element. Moreover, a short-circuit failure state of the switch portion means that the switch element of the switch portion is switched on (conducted state) continuously despite a control signal output to the switch element, or a feedback diode is in the conducted state in both directions, namely, a forward direction and a backward direction thereof.

When a short-circuit failure occurs, if the ON/OFF (conduction/disconnection) control of switch elements in a normal switch portion other than the switch portion occurred with the short-circuit failure is continued, there arises a problem that an excess electric current would flow in the switch portion or the like where the short-circuit has occurred according to an electromotive force occurred in each phase of the motor.

In this regard, the art disclosed in Japanese Patent Laid-open No. H9-46811 disposes a switch in a power distribution path between the capacity and the inverter circuit and a power distribution path between the inverter circuit and the motor. According thereto, when a short-circuit failure occurs in either switch portion of the inverter circuit, it is possible to prevent the electric current from flowing into each switch portion of the inverter circuit by, for example, shutting off the switches thereof.

However, according to the art disclosed in Japanese Patent Laid-open No. H9-46811, multiple switches would be necessary, and therefore, it is disadvantageous.

SUMMARY OF THE INVENTION

The present invention has been accomplished in view of the aforementioned problems, and it is therefore an object of the present invention to provide a controller for a motor capable of preventing a large electric current from flowing into each switch portion of an inverter circuit without the need of providing a switch or the like to block the power distribution between the motor and the inverter circuit when a short-circuit failure occurs in any of the switch portions of the inverter circuit during the operation of the motor by means of an appropriate ON/OFF control (conduction/blockade control) on switch elements in the normal switch portions of the inverter circuit, and a vehicle.

To attain an object described above, the controller for the motor of the present invention, which is powered by a direct-current power source via a multi-phase inverter circuit composed of switch portions having switch elements and feedback diodes connected in parallel to the switch elements disposed at a positive polarity side and a negative polarity side of an arm of each phase, includes: a short-circuit failure detecting member configured to detect an occurrence of a short-circuit failure which causes any switch portion in the inverter circuit to be in a continual conducted state during the operation of the motor; a short-circuit failure polarity determining member configured to determine whether a short-circuit failure switch portion in which an occurrence of a short-circuit failure has been detected by the short-circuit failure detecting member is on the positive polarity side or on the negative polarity side; and a short-circuit failure controlling member configured to control each of the other switch elements except at least the switch element of the short-circuit failure switch portion among the switch portions in the inverter circuit in such a way that all the switch portions on the same polarity side as the short-circuit failure switch portion determined by the short-circuit failure polarity determining member are set in a conducted state and all the switch elements of all the switch portions on the different polarity side from the short-circuit failure switch portion are set in a disconnected state.

The vehicle of the present invention, which is provided with a motor as a driving force generating element, the motor being powered by a direct-current power source via a multi-phase inverter circuit composed of switch portions having switch elements and feedback diodes connected in parallel to the switch elements disposed at a positive polarity side and a negative polarity side of an arm of each phase, includes: a short-circuit failure detecting member configured to detect an occurrence of a short-circuit failure which causes any switch portion in the inverter circuit to be in a continual conducted state during the operation of the motor; a short-circuit failure polarity determining member configured to determine whether a short-circuit failure switch portion in which an occurrence of a short-circuit failure has been detected by the short-circuit failure detecting member is on the positive polarity side or on the negative polarity side; and a short-circuit failure controlling member configured to control each of the other switch elements except at least the switch element of the short-circuit failure switch portion among the switch portions in the inverter circuit in such a way that all the switch portions on the same polarity side as the short-circuit failure switch portion determined by the short-circuit failure polarity determining member are set in a conducted state and all the switch elements of all the switch portions on the different polarity side from the short-circuit failure switch portion are set in a disconnected state.

According to the controller for the motor and the vehicle of the present invention, when an occurrence of a short-circuit failure at any switch portion of the inverter circuit is detected by the short-circuit failure detecting member, whether the short-circuit failure switch portion where the short-circuit failure has occurred is on the positive polarity side (the so-called high side) or on the negative polarity side (the so-called low side) of the inverter circuit is determined by the short-circuit failure polarity determining member. Subsequently, each of the other switch elements except at least the switch element of the short-circuit failure switch portion among the switch portions in the inverter circuit is controlled by the short-circuit failure controlling member in such a way that all the switch portions on the same polarity side as the short-circuit failure switch portion determined by the short-circuit failure polarity determining member are set in a conducted state and all the switch elements of all the switch portions on the different polarity side from the short-circuit failure switch portion are set in a disconnected state.

More specifically, when a short-circuit failure switch portion is determined to be on the positive polarity side, all the switch elements except at least the switch element of the short-circuit failure switch portion on the positive polarity side are controlled to be in the conducted state (ON state) and all the switch elements on the negative polarity side are controlled to be in the disconnected state (OFF state). Meanwhile, when a short-circuit failure switch portion is determined to be on the negative polarity side, all the switch elements except at least the switch element of the short-circuit failure switch portion on the negative polarity side are controlled to be in the conducted state (ON state) and all the switch elements on the positive polarity side are controlled to be in the disconnected state (OFF state)

The short-circuit failure state of a short-circuit switch portion may be caused by a failure on a switch element of the short-circuit failure switch portion and a failure on a feedback diode. In either case, the short-circuit failure switch is kept in the conducted state despite the control on the switch element of the short-circuit failure switch portion. Therefore, it is not obligatory for the short-circuit failure controlling member to control the switch element of the short-circuit failure switch portion so that the switch element is in the conducted state, however, it is acceptable.

At this time, since all the switch portions, including the short-circuit failure switch portion, at the same polarity side as the short-circuit failure switch portion are in the conducted state, the armature coils of each phase in the motor are brought into a mutual short-circuit state through the switch portions being in the conducted state. In this case, the conducted switch portions of each phase of the inverter circuit is flown with a phase current of a magnitude level substantially equal for each phase generated according to the rotation of an output shaft of the motor, the phase current will not be particularly large. Therefore, according to the controller for the motor and the vehicle of the present invention, it is possible to prevent a large electric current from flowing into each switch portion of the inverter circuit without the need of providing a switch or the like to block the power distribution between the motor and the inverter circuit when a short-circuit failure occurs in any of the switch portions of the inverter circuit during the operation of the motor by means of an appropriate ON/OFF control (conduction/blockade control) on switch elements in the normal switch portions of the inverter circuit. In particular, when the motor is mounted in a hybrid vehicle of a parallel type as a driving force generation element, it is possible to enable a continued driving for the vehicle driven by an engine.

In the controller for the motor and the vehicle according to the present invention, the short-circuit failure polarity determining member can determine whether the short-circuit failure switch element is on the positive polarity side or on the negative polarity side according to what is mentioned below.

For example, the controller further includes a phase current detecting member configured to detect a phase current of each phase of the motor, wherein the short-circuit failure polarity determining member determines whether the short-circuit failure switch portion is on the positive polarity side or on the negative polarity side according to a direction of each phase current detected by the phase current detecting member after short-circuit failure polarity determining member has set a power source switch disposed in a power distribution path between the direct-current power source and the inverter circuit in the disconnected state and has output a control signal to all the switch elements in the inverter circuit to set the switch element in the disconnected state.

In other words, in the state where a control signal is output to all the switch elements of the inverter circuit to switch off the switch elements, the short-circuit failure switch portion of the inverter circuit is brought into the conducted state despite the control signal output to the switch elements thereof and the switch elements of the other normal switch portions are in the disconnected state. In this case, each phase current is of the same direction. Moreover, each phase current in the case where the short-circuit failure switch portion is on the positive polarity side and each phase current in the case where the short-circuit failure switch portion is on the negative polarity side are of opposite directions. Accordingly, whether the short-circuit failure switch portion is on the positive polarity side or on the negative polarity side can be determined according to the direction of each phase current detected by the phase current detecting member.

In the case where the short-circuit failure detecting member detects a short-circuit has occurred on a condition whether a switch portion on the positive polarity side and a switch portion on the negative polarity side of an arm corresponding to any of the phase of the inverter circuit during the operation of the motor, the short-circuit failure determining member can detect whether the short-circuit failure switch portion is on the positive polarity side or on the negative polarity side according to whether or not the occurrence of a short-circuit failure has been detected by the short-circuit failure detecting member after short-circuit failure polarity determining member maintains a power source switch disposed in a power distribution path between the direct-current power source and the inverter circuit in the conducted state, outputs a control signal to all the switch elements on any of the positive polarity side and the negative polarity side of the inverter circuit to set the switch elements in the conducted state and a control signal to all the switch elements on the other polarity side to set the switch elements in the disconnected state.

In other words, by maintaining the power source switch disposed in the power distribution path between the direct-current power source and the inverter circuit in the conducted state, outputting a control signal to all the switch elements on any of the positive polarity side and the negative polarity side, which is the different polarity side from the short-circuit failure switch portion, of the inverter circuit to set the switch elements in the conducted state (ON state) and a control signal to all the switch elements on the other polarity side, which is the same polarity side as the short-circuit failure switch portion, to set the switch elements in the disconnected state (OFF state), the switch portions on the positive polarity side and the switch portions on the negative polarity side of a phase corresponding to the short-circuit failure switch portion of the inverter circuit are brought into the conducted state simultaneously. Accordingly, an excess short-circuit current flows through the short-circuit failure switch portion and the switch portions connected thereto in series from the direct-current power source or a smoothing condenser generally disposed on the input side of the inverter circuit. Thus, the occurrence of a short-circuit failure can be detected by the short-circuit failure detecting member.

On the other hand, when a control signal is output to all the switch elements on the same polarity side as the short-circuit failure switch portion to set the switch elements in the conducted state (ON state) and a control signal is output to all the switch elements on the different polarity side from the short-circuit failure switch portion to set the switch elements in the disconnected state (OFF state), the switch portions on the positive polarity side and the switch portions on the negative polarity side in either phase of the inverter circuit cannot be brought into the conducted state simultaneously. Therefore, in this case, there will be no short-circuit failure to be detected by the short-circuit failure detecting member.

Therefore, by maintaining the power source switch disposed in the power distribution path between the direct-current power source and the inverter circuit in the conducted state, and outputting a control signal to all the switch elements on any of the positive polarity side and the negative polarity side of the inverter circuit to set the switch elements in the conducted state and a control signal to all the switch elements on the other polarity side to set the switch elements in the disconnected state, whether the short-circuit failure switch element is on the positive polarity side or on the negative polarity side can be determined according to whether or not the occurrence of the short-circuit failure has been detected by the short-circuit failure detecting member.

According to the vehicle of the present invention, it is desirable that a parallel connection of the switch element and the feedback diode in each switch portion, a series connection of the switch portion on the positive polarity side and the switch portion on the negative polarity side, a connection of a pair of power source terminals and a series circuit of the switch portion on the positive polarity side and the switch portion on the negative polarity side, and a connection of an output terminal and a central point of the series circuit of the switch portion on the positive polarity side and the switch portion on the negative polarity side of each arm in the inverter circuit are conducted through a conductive plate member.

In other words, in the vehicle provided with the motor used as the driving force generation element of the vehicle, even though a power distribution control is not performed on the motor, the output shaft of the motor will be driven to rotate by the kinetic energy or the engine of the vehicle. Consequently, an electromotive force occurs in the armatures of each phase of the motor. Therefore, by providing the conductive plate member in each arm of the inverter circuit, when a short-circuit failure occurs in either switch portion, the conductive member can endure a large electric current to flow therethrough without being fused Accordingly, in the vehicle of the present invention, the excess current can be prevented from flowing into the switch portion of the inverter circuit or the conductive member of the arm by controlling the switching elements of the inverter circuit as mentioned above.

DETAILED DESCRIPTION OF THE PREFERRED EMBODIMENTS

A first embodiment of the present invention will be described in detail with reference to FIG. 1 to FIG. 7.

Figure 1:
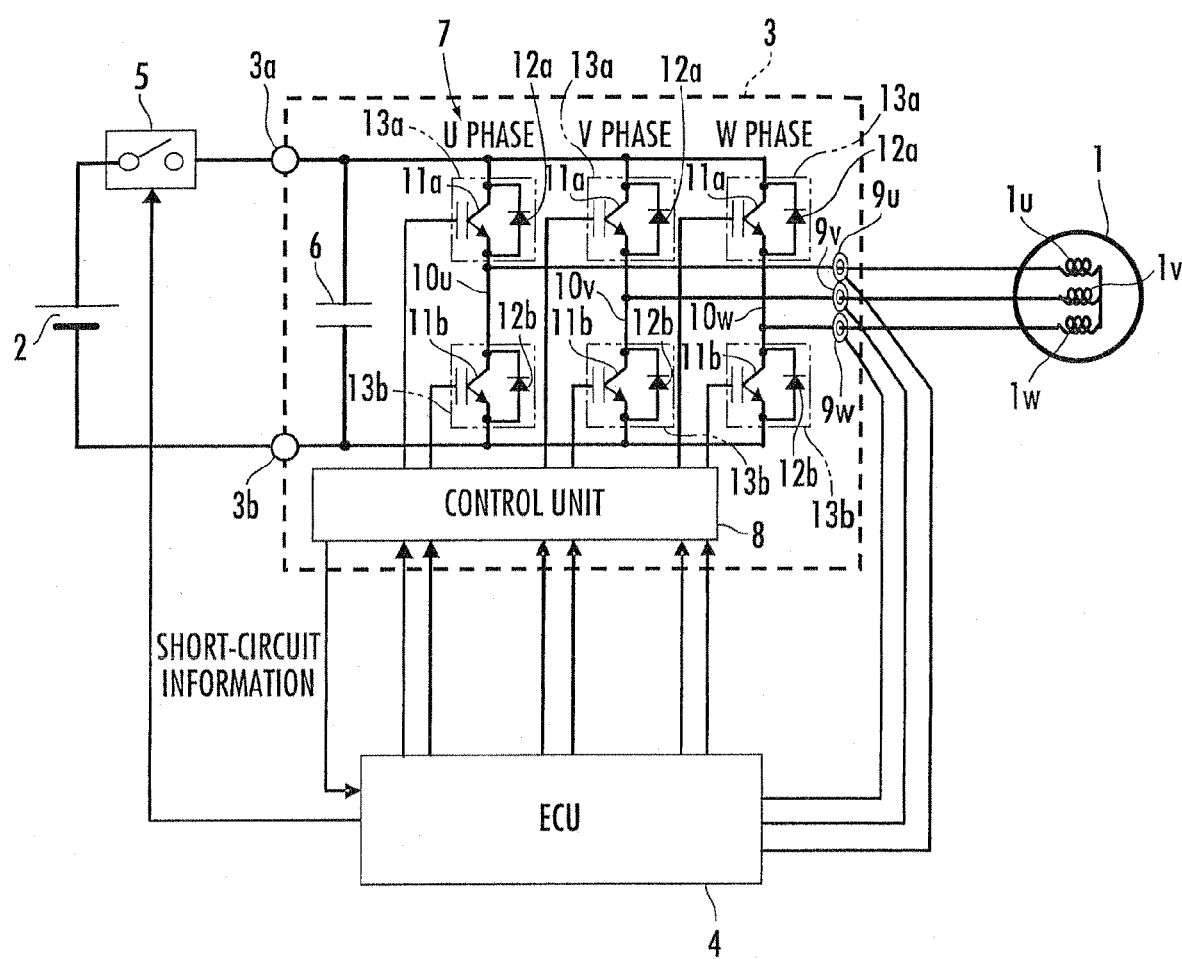
FIG. 1 is a diagram illustrating a circuit of a controller of a motor according to an embodiment of the present invention.

Illustrated in FIG. 1 is a circuit configuration of a controller of a motor in the first embodiment. In FIG. 1, the reference numeral 1 denotes a motor, the reference numeral 2 denotes a capacitor used as a direct-current power source for the motor 1, the reference numeral 3 denotes a power drive circuit unit (hereinafter, referred to as PDU) of the motor 1, and the reference numeral 4 denotes an electronic control unit (hereinafter, referred to as ECU) for performing an operation control on the motor 1 through the intermediary of the power drive circuit unit 3.

The motor 1 is a 3-phase brushless DC motor, for example. In the present embodiment, the motor 1 is mounted in a hybrid vehicle of a parallel type (not shown) as an auxiliary driving force generation element. It is also acceptable to mount the motor 1 in an electric vehicle or in a hybrid vehicle of a series type (not shown) as a driving force generation element. In the case of the hybrid vehicle of a parallel type, an output shaft (rotor) of the motor 1 is connected with an output shaft of an engine and a drive wheel of the vehicle through the intermediary of a transmission, a crutch or the like. In the case of the electric vehicle or the hybrid vehicle of a series type, the output shaft of the motor 1 is connected with a drive wheel of the vehicle through the intermediary of a transmission, a crutch or the like. The structure of the mentioned vehicle may be publicly known.

The capacitor 2 is a secondary battery which can be charged and discharged. A positive pole of the capacitor 2 is connected with a power source terminal 3a on the positive polarity side of the PDU 3 through the intermediary of a contactor 5, and a negative pole thereof is connected with a power source terminal 3b on the negative polarity side of the PDU 3. The contactor 5 functions as a power source switch for the motor 1. By switching on the contactor 5 (conducted state), the capacitor 2 is enabled to supply power to an inverter circuit 7 (to be described hereinafter) of the PDU 3. It is acceptable to use a high-capacity condenser such as a two-layered electric condenser or the like as the capacitor 2. It is also acceptable to use a direct-current power source capable of applying a direct-current voltage from the capacitor 2 to the PDU 3 through a bi-directional DC-DC convertor.

The PDU 3 is provided with a smoothing condenser 6, the inverter circuit 7, a control unit 8 which controls the operation of the inverter circuit 7 according to an instruction issued from the ECU 4, and electric current sensors 9u, 9v, 9w which are used as electric current detecting members for detecting electric currents (phase currents) in armature coils 1u, 1v, 1w of each phase (U phase, V phase, and W phase) of the motor, respectively. The smoothing condenser 6 is connected between the power source terminals 3a and 3b. However, if two phase currents among the three are defined, the last phase current can be defined unambiguously, thus, either one of the electric current sensors 9u, 9v and 9w can be omitted.

The inverter circuit 7 is a 3-phase inverter circuit constituted by connecting arms 10u, 10v, 10w of 3 phases corresponding to each phase of the motor 1, respectively, with the smoothing condenser 6 in parallel between the power source terminals 3a and 3b. Each of the arms 10u, 10v and 10w of the inverter circuit 7 is composed of a pair of switch elements 11a and 11b connected in series and a pair of feedback diodes 12a and 12b connected in parallel to the pair of the switch elements 11a and 11b, respectively. In other words, each of the arms 10u, 10v and 10w is constituted by connecting in series a switch portion 13a and a switch portion 13b. The switch portion 13a is constituted by connecting in parallel the switch element 11a and the feedback diode 12a, and the switch portion 13b is constituted by connecting in parallel the switch element 11b and the feedback diode 12b.

Figure 2:
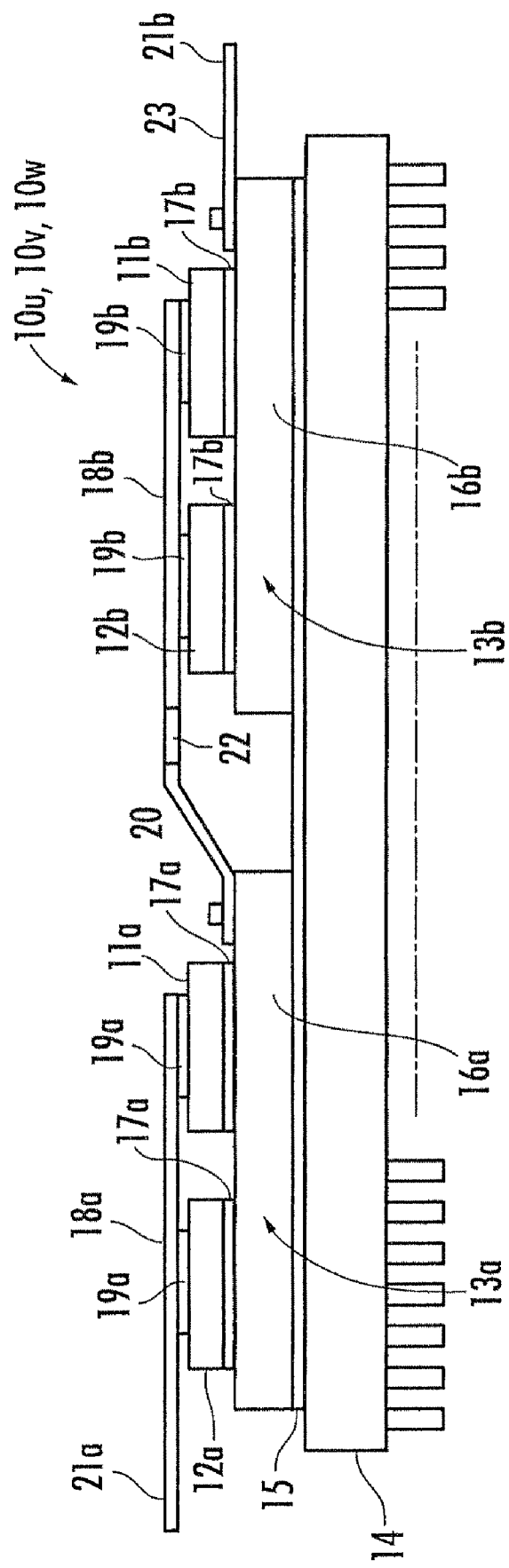
FIG. 2 is a perspective structural view of an arm of an inverter circuit provided in the controller illustrated in FIG. 1.

In the present embodiment, each of the switch elements 11a and 11b is an IGBT (Insulated Gate Bipolar Transistor) and is switched on or off (conducted or disconnected) according to a control signal (a pulse signal) output to a gate thereof. A central point of each of the arms 10u, 10v and 10w (a point between the switch portions 13a and 13b) is connected with the U phase armature coil 1u, the V phase armature coil 1v and the W phase armature coil 1w of the motor 1 through the intermediary of the electric current sensors 9u, 9v and 9w, respectively. Specifically, the IGBT included in each of the switch elements 11a and 11b in the present embodiment is a current sensitive IGBT having a function of detecting an electric current flowing between a collector and an emitter thereof (a function of outputting a detection signal in accordance with the electric current), and the detection signal thereof is configured to be input to the control unit 8. One end of each of the arms 10u, 10v and 10w closer to the switch element 11a (cathode of the collector of the switch element 11a and cathode of the feedback diode 12a) is connected with the power source terminal 3a of the power source terminals 3a and 3b at the positive polarity side, and the other end closer to the switch element 11b (cathode of the emitter of the switch element 11b and anode of the feedback diode 12b) is connected with the power source terminal 3b at the negative polarity side. Hereinafter, the switch element 11a and the switch element 11b may be referred to as the positive polarity side switch element 11a and the negative polarity side switch element 11b, respectively, where appropriate. Similarly, the feedback diode 12a and the feedback diode 12b may be referred to as the positive polarity side feedback diode 12a and the feedback diode 12b, respectively, where appropriate; the switch element 13a and the switch element 13b may be referred to as the positive polarity side switch element 13a and the negative polarity side switch element 13b, respectively, where appropriate. Further, when there is no necessity to differentiate in particular the phases of the arms 10u, 10v and 10w, the electric current sensors 9u, 9v and 9w of the inverter circuit 7, the suffix letters u, v and w are omitted. Furthermore, when there is no necessity to differentiate in particular the switch elements 11a and 11b of each arm 10, the feedback diodes 12a and 12b, or the switch portions 13a and 13b, the suffix letters a and b are omitted. Hereinafter, the detailed structure of each arm 10 of the inverter circuit 7 according to the present embodiment will be described with reference to FIG. 2. FIG. 2 is a diagram illustrating an outline of the structure thereof in profile. As illustrated, each arm 10 is provided with a heat sink 14, an insulation sheet 15 and heat spreaders 16a and 16b. The heat spreaders 16a and 16b are mounted on the heat sink 14 without inter contact thereto with the insulation sheet 15 intervened therebetween. Each of the heat spreaders 16a and 16b is used as a conductive plate member in the present embodiment. The materials for the heat spreaders 16a and 16b may be copper, for example. A chip of the switch element (IGBT) 11a and a chip of the feedback diode 12a are fixed on an upper surface of the heat spreader 16a through a solder 17a. Similarly, a chip of the switch element (IGBT) 11b and a chip of the feedback diode 12b are fixed on the upper surface of the heat spreader 16b through a solder 17b. Thus, the emitter of the switch element 11a and the anode of the feedback 12a are connected through the heat spreader 16a and are conducted to the heat spreader 16a. Similarly, the emitter of the switch element 11b and the anode of the feedback 12b are connected through the heat spreader 16b.

Figure 3:
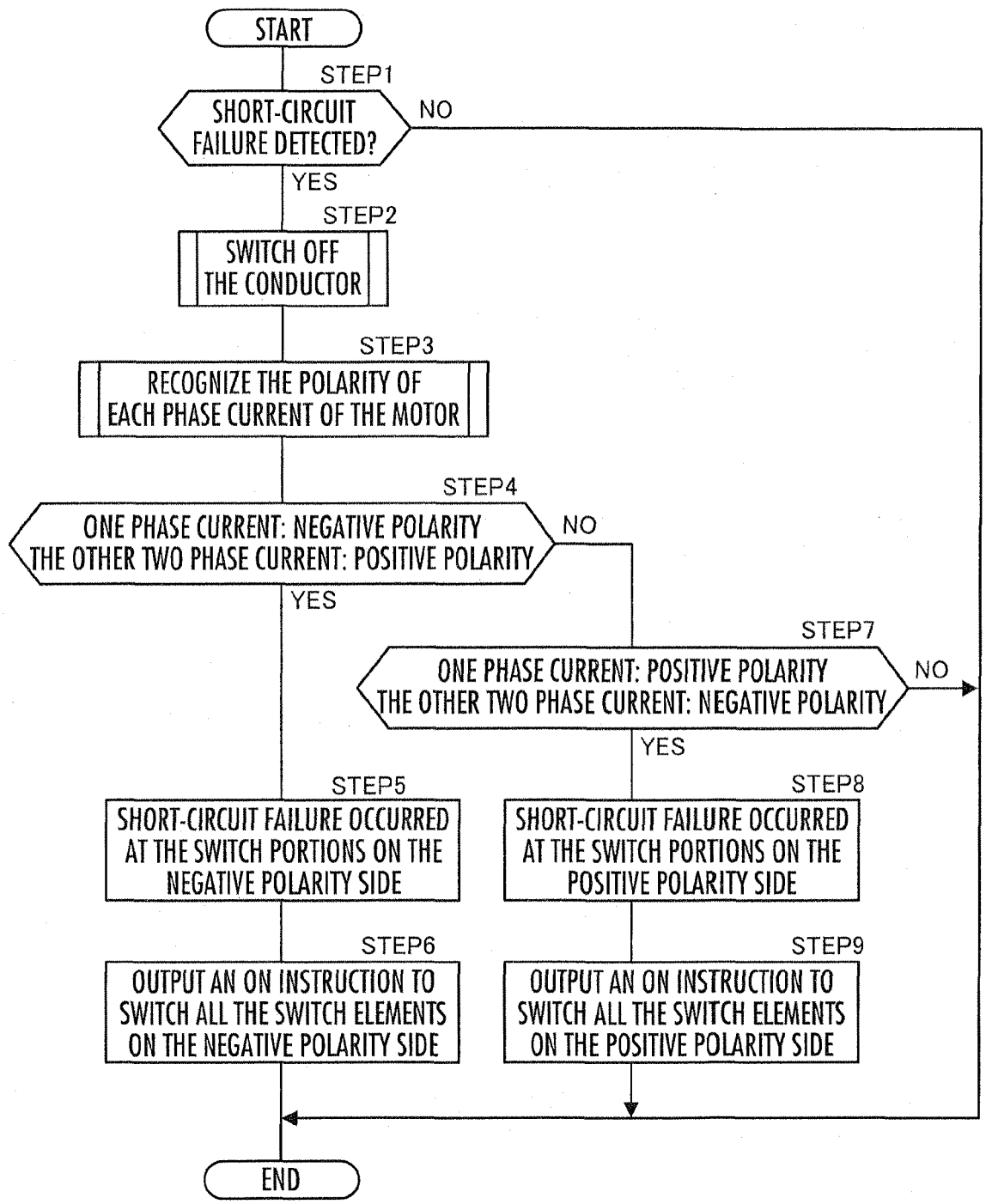
FIG. 3 is a flow chart illustrating a control processing of ECU according to a first embodiment.
Figure 4:
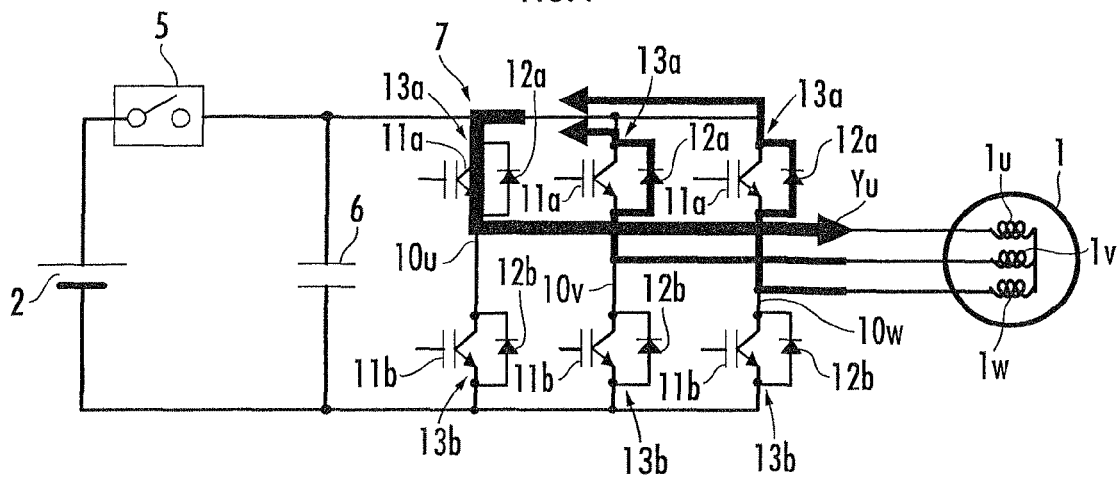
FIG. 4 is a diagram illustrating flows of phase currents immediately after the processing in STEP 2 illustrated in FIG. 3 is performed.
Figure 5:
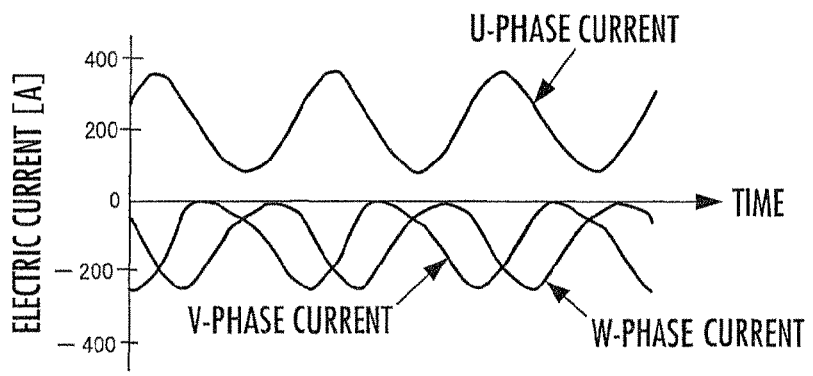
FIG. 5 is a graph illustrating wave shapes of the phase currents illustrated in FIG. 4.
Figure 6:
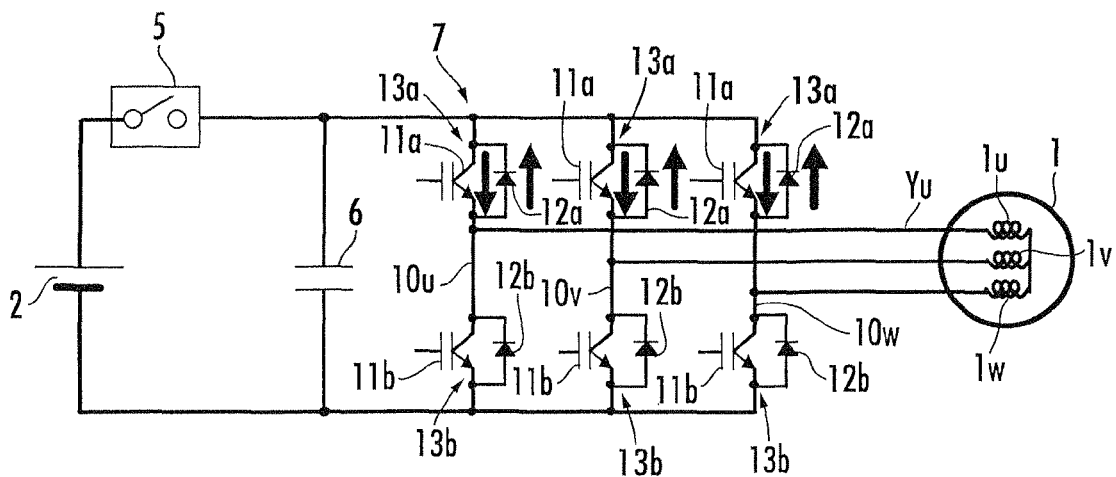
FIG. 6 is a diagram illustrating flows of the phase currents after the processing of the flow chart in FIG. 3 is completed.
Figure 7:
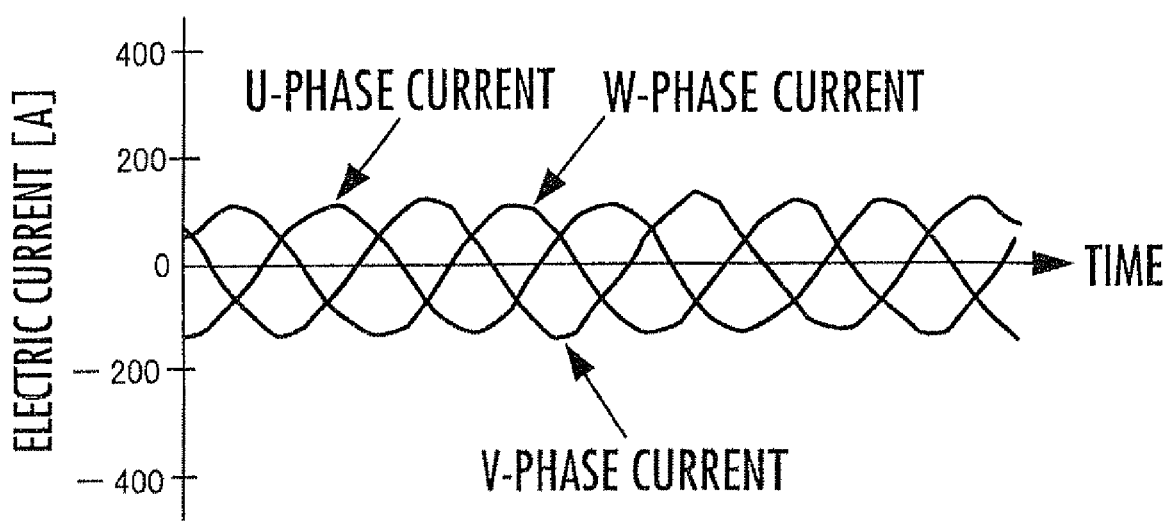
FIG. 7 is a graph illustrating wave shapes of the phase currents illustrated in FIG. 6.

Upper surfaces of the chips of the switch 11a and the feedback diode 12a are fixed with a beam lead 18a serving as the conductive plate member through a solder 19a, and upper surfaces of the chips of the switch 11b and the feedback diode 12b are fixed with a beam lead 18b serving as the conductive plate member through a solder 19b. The materials of the beam leads 18a and 18b may be copper, for example. Thus, the collector of the switch element 11a and the cathode of the feedback 12a are connected through the beam lead 18a and are conducted to the beam lead 18a. Similarly, the collector of the switch element 11b and the cathode of the feedback 12b are connected through the beam lead 18b. A plate-like connection portion 20 is integrally extended from the beam lead 18b toward the heat spreader 16a, and is conductively fixed to the heat spreader 16a by a screw or the like. Each arm 10 is provided with power source terminals 21a and 21b, and an output terminal 22. The power source terminals 21a and 21b are connected to the power source terminals 3a at the positive polarity side and the power source terminals 3b at the negative polarity side of the PDU 3, respectively. The output terminal 22 is connected to either of the armature coils 1u, 1v and 1w of one phase (corresponding to each of the arms 10u, 10v and 10w) of the motor 1. The power source terminal 21a is integrally formed at one end portion of the beam lead 18a. The power source terminal 21b is integrally formed at one end portion of a conductive plate member 23 which is conductively fixed at the heat spreader 16b through a screw or the like. The output terminal 22 is integrally formed at a portion extended from one side (the portion extended vertical to the paper in FIG. 2) of the beam lead 18b. The materials for the conductive member 23 may be copper, for example. According to the above-mentioned connections and structures, the switch element 11a and the feedback diode 12a are connected in parallel through the heat spreader 16a serving as the conductive plate member and the beam lead 18a, and resultantly, to form the switch portion 13a. Similarly, the switch element 11b and the feedback diode 12b are connected in parallel through the heat spreader 16b serving as the conductive plate member and the beam lead 18b, and resultantly, to form the switch portion 13b. The switch portions 13a and 13b are connected in series through the connection portion 20 of the beam lead 18. The connection between the power source terminal 17a and one end of the series circuit of the switch portions 13a and 13b closer to the switch portion 13a is fulfilled by the beam lead 18a serving as the conductive plate member. The connection between the power source terminal 21b and the other end of the series circuit of the switch portions 13a and 13b closer to the switch portion 13b is fulfilled by the conductive plate member 23. Moreover, the connection between the output terminal 22 and the central point of the series circuit of the switch portions 13a and 13b is fulfilled by the beam lead 18b serving as the conductive plate member. Accordingly, the inverter circuit 7 of the present embodiment, the electric current path of each arm 10 is formed through the heat spreaders 16a and 16b serving as the conductive plate member, the beam leads 18a and 18b, the conductive member 23. According thereto, it is difficult for them to be fused out even a large electric current flows into these members. Back again with reference to FIG. 1, the control unit 8 of the PDU 3, a detailed illustration thereof is omitted, is a circuit including a micro computer and a control signal generating circuit configured to output a control signal to each switch element 11. An instruction from the ECU 4 (instruction for designating an operation state for the motor 1) and a detection signal of an electric current in each switch element 11 are input to the control unit 8. The control unit 8 has a function of generating and outputting a control signal to the gate of each switch element 11 in accordance with the instruction from ECU 4 according to PWM control (hereinafter, referred to as a PWM control function), and a function of forcibly switching off the switch element 11 (cancel the output of a control signal for switching on the switch element 11) flown with an electric current when the electric current determined according to a detection signal input from each switch element 11 is an excess current equal to or greater than a given value (for example, equal to or greater than 400 A) and outputting an information signal thereof to the ECU 4 as a short-circuit information (hereinafter, referred to as a short-circuit detection function). During the operation of the motor 1 (a state where electric power is being supplied from the capacitor 2 to the motor 1), two switch elements 11a and 11b of each arm 10 in the inverter circuit 7 are controlled according to the PWM control so that both will not be brought into an ON state simultaneously (two switch portions 13a and 13b of each arm 10 will not be brought into a conducted state simultaneously). However, for example, when a failure which keeps either switch element 11 in a continual ON state despite a control signal output thereto or a failure which causes either diode 12 to be short-circuited continuously in the forward and backward directions, in other words, a short-circuit failure which keeps either switch portion 13 in a continual conducted state occurs, two switch portions of the arm 10 including the switch portion 13 with the short-circuit failure occurred therein are brought into the conducted state simultaneously. At this situation, a large electric current (short-circuit current) flows into two switch portions 13a and 13b from the capacitor 2 or the smoothing condenser 6. The above-mentioned short-circuit detection function of the control unit 8 functions in this situation. In the present embodiment, the control unit 8 of the PDU 3 having the short-circuit detection function is used as a short-circuit failure detecting member in the present invention. The ECU 4 is a circuit unit provided with a CPU, a RAM and a ROM. The detection signal from each electric current sensor 9 and the short-circuit information from the control unit 8 of the PDU 3 are input to the ECU 4. Thereafter, the ECU 4 sequentially generates an instruction (for example, a voltage instruction value for each phase of the motor 1) specifying an ON/OFF timing for each switch element 11 of the inverter circuit 7 according to a feedback control processing so that the electric current value determined according to the detection signal from each electric current sensor 9 (detection value of the phase current) approximates to a desired value during the operation of the motor 1, and outputs the generated instruction to the control unit 8 of the PDU 3. The desired value of each phase current of the motor 1 may be determined in accordance with a torque instruction value (instruction value on an output torque from the motor 1). The torque instruction value may be determined according to an operation amount of an accelerator of the vehicle. The ECU 4 functions as a short-circuit failure polarity determining member and a short-circuit failure controlling member in the present invention, and performs a control processing for determining whether the switch portion 13 with a short-circuit failure occurred therein (hereinafter, referred to as the short-circuit failure switch portion 13) is a positive polarity side switch portion or a negative polarity side switch portion according to the short-circuit information input from the control unit 8 of the PDU 3, and a control processing for switching on all the switch elements 11 on the same polarity side as the short-circuit failure switch portion 13 and switching off all the switch element 11 on the different polarity side from the short-circuit failure switch portion 13. Detailed description on these control processes will be carried out hereinafter. The operation of the controller of the present embodiment, particularly when a short-circuit failure occurs in either switch portion 13 of the inverter circuit 7 will be described with reference to the drawings 3 to 7. FIG. 3 is a flow chart illustrating a control processing of ECU 4 according to the operation. FIG. 4 is a diagram illustrating flows of phase currents immediately after the processing in STEP 2 illustrated in FIG. 3 is performed. FIG. 5 is a graph illustrating wave shapes of the phase currents illustrated in FIG. 4. FIG. 6 is a diagram illustrating flows of the phase currents after the processing of the flow chart in FIG. 3 is completed. FIG. 7 is a graph illustrating wave shapes of the phase currents illustrated in FIG. 6.

With reference to FIG. 3, the ECU 4 determines whether the occurrence of a short-circuit failure has been detected according to the presence of a short-circuit information input from the control unit 8 of the PDU 3 during the operation of the motor 1 (the driving of the vehicle) (STEP 1). If the short-circuit information is not output from the control unit 8, and the occurrence of a short-circuit failure is not detected (the determination result of STEP 1 is negative), the control processing in FIG. 3 is terminated. On the other hand, if the short-circuit information is output from the control unit 8, and therefore the occurrence of the short-circuit failure has been detected (the determination result of STEP 1 is positive), the ECU 4 firstly performs a control processing such as switching off the contactor 5 or the like in STEP 2. According thereto, the capacitor 2 is electrically detached from the inverter circuit 7 and the motor 1 (power transfer between the motor 1 and the capacitor 2 is blocked). Moreover, in STEP 2, the ECU 4 also performs a control processing which outputs an instruction to the control unit 8 of the PDU 3 to switch off all the switch elements 11 (six in total) of the inverter circuit 7. According thereto, the control unit 8 of the PDU 3 outputs a control signal to the gate of each switch element 11 so as to switch off each switch element 11. According to the processing in STEP 2, the switch element 11 in the switch portion 13 (hereinafter, referred to as normal switch portion 13) other than the switch portion 13 where a short-circuit failure has occurred (short-circuit failure switch portion 13) is brought into the OFF state, however, the short-circuit failure switch portion 13 continues to be in the conducted state. In other words, when the switch element 11 of the short-circuit failure switch portion 13 is malfunctioned to be in a continual ON state, even a control signal for switching off the switch element 11 is output thereto, the switch element 11 is kept in the ON state and the conducted state of the short-circuit failure switch portion 13 is continued. Moreover, when the switch element 11 of the short-circuit failure switch portion 13 is functional and the feedback diode 12 is malfunctioned to be conductive in both directions, the switch element 11 of the short-circuit failure switch portion 13 is brought into the OFF state, however, the conducted state of the short-circuit failure switch portion 13 is continued. In addition, when the output shaft of the motor 1 is driven to rotate by the inertia force due to the driving of the vehicle or by the engine disposed in a hybrid vehicle of a parallel type, an electromotive force is generated in accordance with the rotation velocity of the output shaft in the armature coils 1u, 1v and 1w of each phase of the motor 1.

In this situation, at the same time when a phase current of a defined direction (sinusoidal electric current) flows into the armature coil 1u, 1v or 1w (hereinafter, a reference numeral 1x will be attached to the armature coil where appropriate) of one phase corresponding to the short-circuit failure switch portion 13 via the short-circuit failure switch portion 13, a phase current (sinusoidal electric current) of a different direction from the phase current flowing into the armature coil 1x flows into each of the other armature coils of two phases, respectively, via the feedback diode 12a or 12b at the same polarity side as the short-circuit failure switch portion 13 in the two feedback diodes 12a and 12b in the corresponded arm 10. Suppose that the short-circuit failure switch portion 13 is the switch portion 13a on the positive polarity side of the arm 10u of U phase. In the case where the contactor 5 is switched off and the switch elements 11 of the normal switch portion 13 (the switch element 11b of the arm 10u, the switch elements 11a and 11b of the arm 10v and the switch elements 11a and 11b of the arm 10w) are switched off, the phase current flows in a given direction as illustrated by arrows Yu, Yv and Yw in FIG. 4, respectively. As illustrated, the U phase current illustrated by the arrow Yu flows through the switch element 11a or the feedback diode 12a on the positive polarity side of the arm 10u of U phase. The V phase current illustrated by the arrow Yv flows through the feedback diode 12a on the positive polarity side of the arm 10v of V phase, and the W phase current illustrated by the arrow Yw flows through the feedback diode 12a on the positive polarity side of the arm 10w of W phase. FIG. 5 illustrates an example showing the measured wave shape of each phase current in the mentioned case (FIG. 4). In the example, the rotation velocity of the output shaft of the motor 1 is 6000 rpm. As illustrated, the U phase current is a sinusoidal electric current flowing in the direction of positive polarity. The V phase current and the W phase current are both sinusoidal electric currents flowing in the direction of negative polarity (opposite direction of polarity to the U phase current). In the present embodiment, if a phase current is flowing from the inverter circuit 7 toward each of the phase armatures 1u, 1v and 1w, the direction of polarity for each phase current is set as a positive polarity.

As mentioned above, when one switch portion 13a among the switch portions 13 of the inverter circuit 7 on the positive polarity side becomes a short-circuit failure switch portion, the phase current of a phase corresponding to the short-circuit failure switch portion 13a becomes a sinusoidal electric current of positive polarity, and the other two phase currents become sinusoidal electric currents of negative polarity. Herein, the phase current of the phase corresponding to the short-circuit failure switch portion 13a flows through the switch element 11a or the feedback diode 12a of the short-circuit failure switch portion 13a, and the other two phase currents flow respectively through the feedback diode 12a on the positive polarity side of the arm 10 of a corresponding phase. Similarly, when one switch portion 13b among the switch portions 13 on the negative polarity side becomes a short-circuit failure switch portion, the phase current of a phase corresponding to the short-circuit failure switch portion 13b becomes a sinusoidal electric current of negative polarity, and the other two phase currents become sinusoidal electric currents of positive polarity. Herein, the phase current of the phase corresponding to the short-circuit failure switch portion 13b flows through the switch element 11b or the feedback diode 12b of the short-circuit failure switch portion 13b, and the other two phase currents flow respectively through the feedback diode 12b on the negative polarity side of the arm 10 of a corresponding phase. In the above-mentioned cases, the magnitude (absolute value) of the phase current flowing in the short-circuit failure switch portion 13 is equal to the sum of the magnitudes (absolute value) of the phase currents of the other two phases. However, when the rotation velocity of the output shaft of the motor 1 is relatively great, the RMS value of the phase current flowing in the short-circuit failure switch portion 13 becomes relatively large. For example, in the example of FIG. 5, the RMS value of the U phase current is as great as 240 A roughly. Meanwhile, the RMS value of the V phase current and the W phase current is around 145 A, smaller than the RMS value of the U phase current. Thus, if a great phase current continues to flow through the short-circuit failure switch portion 13, the chip in the switch element 11 and the feedback diode 12, and the electrical wires in the beam lead 16a or 16b are probably subjected to an excessively high temperature. Therefore, in the present embodiment, subsequent to STEP 2, the ECU 4 performs a control processing which will be described later after STEP 3 to prevent an excess current from flowing into the short-circuit failure switch portion 13 and the like. In STEP 3, the ECU 4 performs a recognition processing on the polarity (direction) of each phase current of the motor 1 on the basis of the detection signals from the electric current sensors 9u, 9v and 9w. Specifically, the ECU 4, for example, sequentially samples a value of each phase current detected by each electric current sensor 9 in a given duration and then calculates the average value of each phase current in the duration. Thereafter, the ECU 4 recognizes the polarity (direction) of each phase current on the basis of a sign of the average value. Next in STEP 4, the ECU 4 determines whether or not the polarity of one phase current among the three phase currents is of negative polarity and the other two phase currents are of positive polarity. If the determination result is positive, the ECU 4 confirms that a short-circuit failure has occurred in either of the three switch portions 13b, 13b and 13b on the negative polarity side in STEP 5. Thereafter, in STEP 6, the ECU 4 outputs to the control unit 8 of the PDU 3 an instruction of switching on all the switch elements 11b, 11b and 11b on the negative polarity side. The processing in FIG. 3 is terminated. The control unit 8 outputs the control signal of switching on all the switch elements 11b, 11b and 11b on the negative polarity side to the gate of each switch element 11b on the negative polarity side according to the instruction output from the ECU 4. According thereto, the short-circuit failure switch portion 13b and all the switch elements 11b, 11b and 11b on the same polarity side (here, the negative polarity side) as the switch portion 13b are switched on, and consequently, all the switch portions 13b, 13b and 13b on the negative polarity side are brought into the conducted state.

Meanwhile, each switch element 11a on the different polarity side (here, the positive polarity side) from the short-circuit failure switch portion 13b is kept in the OFF state. On the other hand, if the determination result in STEP 4 is negative, the ECU 4 determines whether or not the polarity of one phase current among the three phase currents is positive and the other two phase currents is of negative polarity in STEP 7. If the determination result of this step is positive, the ECU 4 confirms that a short-circuit failure has occurred in either of the three switch portions 13a, 13a and 13a on the positive polarity side in STEP 8. Thereafter, in STEP 9, the ECU 4 outputs to the control unit 8 of the PDU 3 an instruction of switching on all the switch elements 11a, 11a and 11a on the positive polarity side. The processing in FIG. 3 is terminated. The control unit 8 outputs the control signal of switching on all the switch elements 11a, 11a and 11a on the positive polarity side to the gate of each switch element 11a on the positive polarity side according to the instruction output from the ECU 4. According thereto, the short-circuit failure switch portion 13a and all the switch elements 11a, 11a and 11a on the same polarity side (here, the positive polarity side) as the switch portion 13a are switched on, and consequently, all the switch portions 13a, 13a and 13a on the positive polarity side are brought into the conducted state. Meanwhile, each switch element 11b on the different polarity side (here, the negative polarity side) from the short-circuit failure switch portion 13a is kept in the OFF state.

In supplementation, due to the affection from noises and the like when the motor 1 is in operation, the two switch elements 11a and 11b of either arm 10 in the inverter circuit 7 may be temporarily brought into the ON state at the same time. Further, after a short-circuit failure occurs in the switch element 11 of either switch portion 13 and the two switch portions 13a and 13b of the arm 10 containing the short-circuit failure switch portion 13 are brought into the conducted state simultaneously, it is possible that a failure may occur to bring the switch element 11 of the switch portion 13 into the OFF state. Even in these cases, the short-circuit information is output from the control unit 8 of the PDU 3 and the control processing starting from STEP 2 is performed according to the present embodiment. However, in the above-mentioned cases, since all the switch elements 11 of the switch portion 13 in the inverter circuit 7 are in the OFF state in the processing of STEP 3, the determination result of STEP 4 and the determination result of STEP 7 are both negative. Thereby, the ECU 4 will terminate the control processing in FIG. 3 without performing the processing of STEP 6 or STEP 9. According thereto, each switch element 11 of the inverter circuit 7 is kept in the OFF state. The processing in STEP 2 to STEP 5, STEP 7 and STEP 8 in the present embodiment is fulfilled by the short-circuit failure polarity determining member of the present invention. The processing in STEP 6 and STEP 9 is fulfilled by the short-circuit failure controlling member of the present invention.

Figure 8:
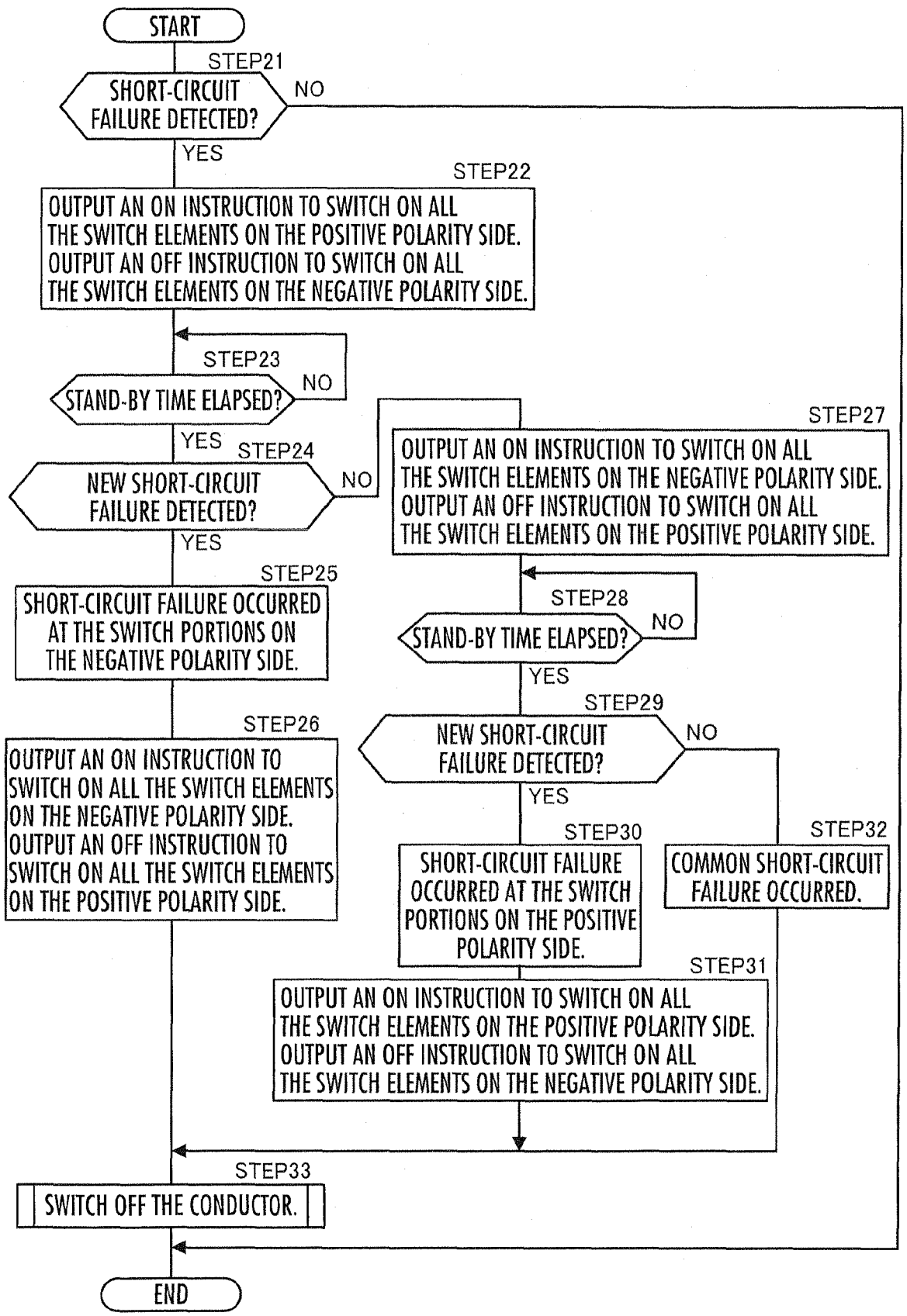
FIG. 8 is a flow chart illustrating a control processing of ECU according to a second embodiment.

According to the control processing in FIG. 3 described above, when a short-circuit failure occurs to bring either of the switch portions 13 into the conducted state, the switch elements 11 of the other two normal switch portions 13 on the same polarity side as the short-circuit failure switch portion 13 are controlled to be kept in the ON state finally. Thereby, the short-circuit failure switch portion 13 and all the other switch portions 13 on the same polarity side as the short-circuit failure switch portion 13 are brought into the conducted state, and meanwhile, all the switch elements on the different side from the short-circuit failure switch portion 13 are controlled to be in the OFF state. Therefore, for each arm 10 of the inverter circuit 7, the switch portions 13 at the same polarity side as the short-circuit failure switch portion 13 (the parallel circuit composed of the switch elements 11 and the feedback diodes 12) are in the conducted state in both directions. For example, if a short-circuit failure occurs in the switch portion 13a of U phase on the positive polarity side, as illustrated by the arrows in FIG. 6, the switch portions 13 in each arm 10 are brought into the conducted state in both directions. When a short-circuit failure occurs in either switch portion 13 on the negative polarity side, the situation is the same. Accordingly, one end of each of the armature coils 1u, 1v and 1w of each phase of the motor 1, which is closer to the inverter circuit 7, are inter short-circuited substantially. Thus, each phase current flowing in accordance with the rotations of the output shaft of the motor 1 becomes a sinusoidal alternative current having substantially equal amplitude in each phase. FIG. 7 illustrates an example showing the measured wave shape of each phase current in all the switch portions 13a, 13a and 13a on the positive polarity side when all the switch portions are in the conducted state in the case where a short-circuit failure occurs in the switch portion 13a of U phase on the positive polarity side. As illustrated, each phase current is a sinusoidal alternative current having substantially equal amplitude. The rotation velocity of the output shaft of the motor 1 in FIG. 7 is the same as that in FIG. 5. In this situation, the RMS value of each phase current is relative smaller than that in the situation immediately after the contactor 5 is switched off and all the switch elements 11 except the switch element 11 of the switch portion 13 with a short-circuit failure occurred are switched off. For example, as illustrated in FIG. 7, the RMS value of each phase current, including that of the U phase corresponding to the switch portion 13a on the positive polarity side, namely, the short-circuit failure switch portion, is roughly 81 A. Therefore, compared with that in FIG. 5 (240 A), the RMS value of the U phase current corresponding to the short-circuit failure switch portion 13a is reduced to one third thereof. Thus, by switching the short-circuit failure switch portion 13 and all the other switch portions 13 on the same polarity side into the conducted state, the excess electric current can be prevented from flowing into the short-circuit failure switch portion 13. Particularly, when the motor 1 is mounted in a hybrid vehicle of a parallel type as an auxiliary driving force generation element, it is possible for the vehicle to have a continual moving driven by an engine thereof used as the other driving force generation element. When any of the switch portions 13 has a short-circuit failure occurred therein, it is possible that a large electric current would flow into the switch portions 13. However, according to the present embodiment mentioned above, the conductive plate member, such as the beam leads 18a, 18b or the like is disposed in the electric current path of each arm 10 of the inverter circuit 7, an excess current can be prevented from flowing into the switch portion 13 without welding out the conductive member. In the present embodiment, when the determination result of STEP 4 is NO, the determination processing is performed in STEP 7; however, it is acceptable to perform the processing in STEP 9 by taking the short-circuit failure switch portion 13 as the switch portion 13 on the positive polarity side when the determination result of STEP 4 is NO. As an alternative to the determination processing of STEP 4, it is acceptable to perform the determination processing of STEP 7 and subsequently the processing of STEP 9 and STEP 6, respectively, in accordance with the positive or negative determination result in STEP 7. It is also acceptable to reverse the processing order of the determination processing of STEP 4 and STEP 7 mentioned in the present embodiment. A second embodiment of the present invention will be described with reference to FIG. 8. FIG. 8 is a flow chart illustrating a control processing of ECU 4 according to the present embodiment. In the present embodiment, only the control processing of the ECU 4, which is performed when a short-circuit failure described in the first embodiment occurs, is different from the first embodiment. Therefore, in the descriptions of the present embodiment, the same numerals are used to refer to the same or identical parts or those having identical functions in the first embodiment and descriptions thereof are omitted.

Referring to FIG. 8, the ECU 4 in the present embodiment performs the same determination processing in STEP 21 as that of STEP 1 in the first embodiment during the operation of the motor 1 (the driving of the vehicle). If the determination result is negative (the occurrence of a short-circuit failure is not detected by the control unit 8 of the PDU 3), the control processing in FIG. 8 is terminated.

On the other hand, if the determination result of STEP 21 is positive, the ECU 4 outputs an instruction for switching on, for example, all the switch elements 11a, 11a and 11a on the positive polarity side and an instruction for switching off, for example, all the switch elements 11b, 11b and 11b on the negative polarity side to the control unit 8 of the PDU 3. Thereafter, the ECU 4 stands by at this situation for a given standby time (STEP 23). While in standing by, the ECU 4 determines whether or not the occurrence of a new short-circuit failure is detected according to whether a short-circuit information is input from the control unit 8 of the PDU 3 or not in STEP 24.

When a short-circuit failure occurs in either switch portion 13b on the negative polarity side and the determination result of STEP 21 is positive, after the processing of STEP 22 has been performed, the two switch portions 13a and 13b of the arm 10 corresponding to the short-circuit failure switch portion 13b on the negative polarity side are brought into the conducted state simultaneously during the standby in STEP 23. Thereby, an excess short-circuit current flows into the two switch portions 13a and 13b of the arm 10 from the capacitor 2 or the smoothing condenser 6, and it is detected by the short-circuit detection function of the control unit 8 of the PDU 3. Consequently, the control unit 8 outputs the short-circuit information to ECU 4.

Thus, when a short-circuit failure occurs in either switch portion 13b on the negative polarity side and the determination result of STEP 21 is positive, the determination result of STEP 24 is positive. In this situation, the ECU 4 confirms that a short-circuit failure has occurred in either of the three switch portions 13b, 13b and 13b on the negative polarity side in STEP 25. Thereafter in STEP 26, the ECU 4 outputs an instruction to the control unit 8 of the PDU 3 to switch on all the switch elements 11b, 11b and 11b on the negative polarity side and an instruction to the control unit 8 of the PDU 3 to switch off all the switch elements 11a, 11a and 11a on the positive polarity side.

According to the instructions output from the ECU 4, the control unit 8 of the PDU 3 outputs a control signal for switching on all the switch elements 11b, 11b and 11b on the negative polarity side to the gate of each switch element 11b, and a control signal for switching off all the switch elements 11a, 11a and 11a on the positive polarity side to the gate of each switch element 11a. According thereto, the short-circuit failure switch portion 13b and all the switch elements 11b, 11b and 11b on the same polarity side (the negative polarity side) as the short-circuit failure switch portion 13b are switched on (consequently, all the switch portions 13b, 13b and 13b on the negative polarity side are brought into the conducted state), and all the switch elements 11a, 11a and 11a on the different polarity side (the positive polarity side) from the short-circuit failure switch portion 13b are switched off.

In supplementation, when a short-circuit failure occurs in either switch portion 13a on the positive polarity side and the determination result of STEP 21 is positive, all the switch elements 11b of each switch portion 13b on the negative polarity side are switched off during the standby in STEP 23. Therefore, it is impossible for the two switch portions 13a and 13b of either arm 10 in the inverter circuit 7 to be brought into the conducted state simultaneously. In this situation, as described above with reference to FIG. 6 and FIG. 7, although the phase current flows through the short-circuit failure switch portion 13a on the positive polarity side during the standby in STEP 23, the phase current is not as great as the excess current (about 400 to 1000 A) which can be detected by the short-circuit detection function of the control unit 8.

Thus, when a short-circuit failure occurs in either switch portion 13a on the positive polarity side and the determination result of STEP 21 is positive, the determination result of STEP 24 cannot be positive.

After the processing of STEP 26 is performed, the ECU 4 switches off the contactor 5 in STEP 33, and the processing in FIG. 8 is terminated. Here, the contactor 5 is switched off in order to prevent a minor pulsating electric current from travelling into the capacitor 2, and as a result thereof, to avoid the deterioration or the like of the capacitor 2.

When there is no new short-circuit information being output from the control unit 8 during the standby in STEP 23 and the determination result in STEP 24 is negative, the ECU 4 outputs an instruction to the control unit 8 of the PDU 3 to switch on all the switch elements 11b, 11b and 11b on the negative polarity side and an instruction to the control unit 8 of the PDU 3 to switch off all the switch elements 11a, 11a and 11a on the positive polarity side in the subsequent STEP 27. Thereafter, similar to that in STEP 23, the ECU 4 stands by at this situation for a given standby time (STEP 28). While in standing by, the ECU 4 determines whether or not the occurrence of a new short-circuit failure is detected according to whether a short-circuit information is input from the control unit 8 of the PDU 3 or not in STEP 29.

When a short-circuit failure occurs in either switch portion 13a on the positive polarity side and the determination result of STEP 21 is positive, the two switch portions 13a and 13b of the arm 10 corresponding to the short-circuit failure switch portion 13a on the positive polarity side are brought into the conducted state simultaneously during the standby in STEP 28. Thereby, similar to what has been described in STEP 24, an excess short-circuit current flows into the two switch elements 11a and 11b of the arm 10, and the short-circuit information is output to ECU 4 from the control unit 8 of the PDU 3.

Thus, when a short-circuit failure occurs in either switch portion 13a on the positive polarity side and the determination result of STEP 21 is positive, the determination result of STEP 29 is positive during the standby in STEP 28. In this situation, the ECU 4 confirms that a short-circuit failure has occurred in either of the three switch portions 13a, 13a and 13a on the positive polarity side in STEP 30. Thereafter in STEP 31, the ECU 4 outputs an instruction to the control unit 8 of the PDU 3 to switch on all the switch elements 11a, 11a and 11a on the positive polarity side and an instruction to the control unit 8 of the PDU 3 to switch off all the switch elements 11b, 11b and 11b on the negative polarity side.

According to the instructions output from the ECU 4, the control unit 8 of the PDU 3 outputs a control signal to the gate of each switch element 11a to switch on all the switch elements 11a, 11a and 11a on the positive polarity side, and a control signal to the gate of each switch element 11b to switch off all the switch elements 11b, 11b and 11b on the negative polarity side. According thereto, the short-circuit failure switch portion 13a and all the switch elements 11a, 11a and 11a on the same polarity side (the positive polarity side) as the short-circuit failure switch portion 13a are switched on (consequently, all the switch portions 13a, 13a and 13a on the positive polarity side are brought into the conducted state), and all the switch elements 11b, 11b and 11b on the different polarity side (the negative polarity side) from the short-circuit failure switch portion 13a are switched off.

Then, the processing in FIG. 8 is terminated after the ECU 4 performs the processing in STEP 30 and the processing in STEP 33 (switching off the contactor 5).

On the other hand, when the determination result in STEP 29 is negative, the ECU 4 confirms that a common short-circuit is occurred in STEP 32. Thereafter, the ECU 4 terminates the processing of FIG. 8 after the processing in STEP 33 (switching off the contactor 5). Herein, the situation where the determination result in STEP 29 is negative means that either switch portion 13 has no the short-circuit failure occurred therein. Specifically, similar to the situation where the determination result is negative in STEP 7 of FIG. 3 of the first embodiment, the situation where the determination result in STEP 29 is negative means that the two switch elements 11a and 11b of either arm 10 in the inverter circuit 7 are temporarily brought into the ON state by the noises during the operation of the motor 1, and consequently, the determination result of STEP 21 is positive; or after either switch portion 13 temporarily has encountered a short-circuit failure, the switch elements 11 of the switch portion 13 encounter a failure of being in a continual OFF state. "A common short-circuit" in STEP 29 means that the switch portion 13 is temporarily in a short-circuit failure state.

The processing in STEP 22 to STEP 25, STEP 28 to STEP 30 in the present embodiment is fulfilled by the short-circuit failure polarity determining member of the present invention. The processing in STEP 27 and STEP 32 is fulfilled by the short-circuit failure controlling member of the present invention.

According to the control processing in FIG. 8 described above, when a short-circuit failure occurs to keep either of the switch portions 13 in the conducted state, the switch elements 11 of the other two normal switch portions 13 on the same polarity side as the short-circuit failure switch portion 13 are controlled to be kept in the ON state. Thereby, the short-circuit failure switch portion 13 and all the other switch portions 13 on the same polarity side as the short-circuit failure switch portion 13 are brought into the conducted state. Thus, similar to the first embodiment, the excess electric current can be prevented from flowing into the switch elements 11 of the short-circuit failure switch portion 13 or the diodes 12. Particularly, when the motor 1 is mounted in a hybrid vehicle of a parallel type as an auxiliary driving force generation element, it is possible for the vehicle to have a continual moving driven by an engine used as the other driving force generation element thereof. In the present embodiment, the electric current path of each arm 10 in the inverter circuit 7 is disposed with the beam leads 18a and 18b, therefore, similar to the first embodiment, the electric current flowing through the switch portions 13 can be effectively prevented from becoming excessively great.

Although in the present embodiment, the processing from STEP 27 to STEP 29 is performed when the determination result in STEP 24 is NO, it is acceptable to determine that the short-circuit failure switch portion 13 is the switch portion 13a on the positive polarity side when the determination result in STEP 24 is NO and perform the processing in STEP 31 thereafter. It is acceptable to perform the processing from STEP 27 to STEP 29 as a substitute for the processing from STEP 22 to STEP 24, and perform the processing in STEP 31 and STEP 26, respectively, in accordance with the positive or negative determination result in STEP 29. It is also acceptable to reverse the processing order of the determination processing from STEP 22 to STEP 24 and the processing from STEP 27 to STEP 29 mentioned in the present embodiment. Furthermore, it is acceptable to omit the processing of switching off the contactor 5 in STEP 33.

As aforementioned in the first and second embodiments, the current sensitive IGBT is used as the switch element 11 of the inverter circuit 7, and the occurrence of a short-circuit failure is detected by the control unit 8 according to the current detection signal output from the IGBT. However, it is acceptable to detect the occurrence of a short-circuit failure with the other approaches. For example, it is acceptable to detect the occurrence of a short-circuit failure according to the detection signals from the electric current sensors 9u, 9v and 9w. Alternatively, it is also acceptable to monitor a generated voltage (voltage between the collector and the emitter of the IGBT) of each switch element 11 or a temperature of each switch element 11 with an appropriate sensor, and detect the occurrence of a short-circuit failure according to the generated voltage or the temperature detected.

INDUSTRIAL APPLICABILITY

As mentioned above, the present invention is applicable as a control unit of a motor or a vehicle mounted with the motor capable of preventing a great electric current from flowing into each switch portion of an inverter circuit when a short-circuit failure occurs in either switch portion of the inverter circuit.

What is claimed is:

1. A controller for a motor which is powered by a direct-current power source via a multi-phase inverter circuit composed of switch portions having switch elements and feedback diodes connected in parallel to the switch elements disposed at a positive polarity side and a negative polarity side of an arm of each phase, comprising:

a short-circuit failure detecting member configured to detect an occurrence of a short-circuit failure which causes any switch portion in the inverter circuit to be in a continual conducted state during the operation of the motor;

a short circuit failure polarity determining member configured to determine whether a short-circuit failure switch portion in which an occurrence of a short-circuit failure has been detected by the short-circuit failure detecting member is on the positive polarity side or on the negative polarity side;

a short-circuit failure controlling member configured to control each of other switch element of the other switch portions except at least the short-circuit failure switch portion among the switch portions in the inverter circuit in such a way that a first group of the switch portions among the switch portions on the same polarity side as the short-circuit failure switch portion determined by the short-circuit failure polarity determining member are in a conducted state and the switch elements of a second group of the switch portions among the other switch portions on the different polarity side from the short-circuit failure switch portion are in a disconnected state; and a phase current detecting member configured to detect a phase current of each phase of the motor, wherein the short-circuit failure polarity determining member determines whether the short-circuit failure switch portion is on the positive polarity side or on the negative polarity side according to a direction of each phase current detected by the phase current detecting member after short-circuit failure polarity determining member has set a power source switch disposed in a power distribution path between the direct-current power source and the inverter circuit in the disconnected state and has output a control signal to all the switch elements in the inverter circuit to set the switch element in the disconnected state.

2. A vehicle provided with a motor as a driving force generating element, the motor being powered by a direct-current power source via a multi-phase inverter circuit composed of switch portions having switch elements and feedback diodes connected in parallel to the switch elements disposed at a positive polarity side and a negative polarity side of an arm of each phase comprising:

a short-circuit failure detecting member configured to detect an occurrence of a short-circuit failure which causes any switch portion in the inverter circuit to be in a continual conducted state during the operation of the motor;

a short-circuit failure polarity determine member configured to determine whether a short-circuit failure switch portion in which an occurrence of a short-circuit failure has been detected by the short-circuit failure detecting member is on the positive polarity side or on the negative polarity side;

a short-circuit failure controlling member configured to control each of other switch element of the other switch portions except at least the short-circuit failure switch portion among the switch portions in the inverter circuit in such a way that a first group of the switch portions among the switch portions on the same polarity side as the short-circuit failure switch portion determined by the short-circuit failure polarity determining member are in a conducted state and the switch elements of a second group of the switch portions among the other switch portions on the different polarity side from the short-circuit failure switch portion are in a disconnected state; and a phase current detecting member configured to detect a phase current of each phase of the motor, wherein the short-circuit failure polarity determining member determines whether the short-circuit failure switch portion is on the positive polarity side or on the negative polarity side according to a direction of each phase current detected by the phase current detecting member after short-circuit failure polarity determining member sets a power source switch disposed in a power distribution path between the direct-current power source and the inverter circuit in the disconnected state and outputs a control signal to all the switch elements in the inverter circuit to set the switch elements in the disconnected state.

3. The vehicle according to claim 2, wherein a parallel connection of the switch element and the feedback diode in each switch portion, a series connection of the switch portion on the positive polarity side and the switch on the negative polarity side, a connection of a pair of power source terminals and a series circuit of the switch portion on the positive polarity side and the switch portion on the negative polarity side, and a connection of an output terminal and a central point of the series circuit of the switch portion on the positive polarity side and the switch portion on the negative polarity side of each arm in the inverter circuit are conducted through a conductive plate member.

4. A controller for a motor which is powered by a direct-current power source via a multi-phase inverter circuit composed of switch portions having switch elements and feedback diodes connected in parallel to the switch elements disposed at a positive polarity side and a negative polarity side of an arm of each phase, comprising:

a short-circuit failure detecting member configured to detect an occurrence of a short circuit failure which causes any switch portion in the inverter circuit to be in a continual conducted state during the operation of the motor;

a short-circuit failure polarity determining member configured to determine whether a short-circuit failure switch portion in which an occurrence of a short-circuit failure has been detected by the short-circuit failure detecting member is on the positive polarity side or on the negative polarity side; and a short-circuit failure controlling member configured to control each of other switch element of the other switch portion except at least the short-circuit failure switch portion among the switch portions in the inverter circuit in such a way that a first group of the switch portions among the switch portions on the same polarity side as the short-circuit failure switch portion determined by the short-circuit failure polarity determining member are in a conducted state and the switch elements of a second group of the switch portions among the other switch portions on the different polarity side from the short-circuit failure switch portion are in a disconnected state;

wherein:

the short-circuit failure detecting member detects a short-circuit has occurred on a condition when a switch portion on the positive polarity side and a switch portion on the negative polarity side of an arm corresponding to any of the phase of the inverter circuit are in a conducted state during the operation of the motor, and the short-circuit failure polarity determining member detects whether the short-circuit failure switch portion is on the positive polarity side or on the negative polarity side according to whether or not the occurrence of a short-circuit failure has been detected by the short-circuit failure detecting member after the short-circuit failure polarity determining member maintains a power source switch disposed in a power distribution path between the direct-current power source and the inverter circuit in the conducted state, outputs a control signal to all the switch elements on any of the positive polarity side and the negative polarity side of the inverter circuit to set the switch elements in the conducted state and a control signal to all the switch elements on the other polarity side to set the switch elements in the disconnected state.

5. A vehicle provided with a motor as a driving force generating element, the motor being powered by a direct-current power source via a multi-phase inverter circuit composed of switch portions having switch elements and feedback diodes connected in parallel to the switch elements disposed at a positive polarity side and a negative polarity side of an arm of each phase, comprising:

a short-circuit failure detecting member configured to detect an occurrence of a short-circuit failure which causes any switch portion in the inverter circuit to be in a continual conducted state during the operation of the motor;

a short-circuit failure polarity determining member configured to determine whether a short-circuit failure switch portion in which an occurrence of a short-circuit failure has been detected by the short-circuit failure detecting member is on the positive polarity side or on the negative polarity side; and a short-circuit failure controlling member configured to control each of other switch element of the other switch portions except at least the short-circuit failure switch portion among the switch portions in the inverter circuit in such a way that a first group of the switch portions among the switch portions on the same polarity side as the short-circuit failure switch portion determined by the short-circuit failure polarity determining member are in a conducted state and the switch elements of a second group of the switch portions among the other switch portions on the different polarity side from the short-circuit failure switch portion are in a disconnected state;

wherein:

the short-circuit failure detecting member detects a short-circuit has occurred on a condition when a switch portion on the positive polarity side and a switch portion on the negative polarity side of an arm corresponding to any of the phase of the inverter circuit are in a conducted state during the operation of the motor, and the short-circuit failure polarity determining member detects whether the short-circuit failure switch portion is on the positive polarity side or on the negative polarity side according to whether or not the occurrence of a short-circuit failure has been detected by the short-circuit failure detecting member after the short-circuit failure polarity determining member maintains a power source switch disposed in a power distribution path between the direct-current power source and the inverter circuit in the conducted state, outputs a control signal to all the switch elements on any of the positive polarity side and the negative polarity side of the inverter circuit to set the switch elements in the conducted state and a control signal to all the switch elements on the other polarity side to set the switch elements in the disconnected state.

6. The vehicle according to claim 5, wherein a parallel connection of the switch element and the feedback diode in each switch portion, a series connection of the switch portion on the positive polarity side and the switch on the negative polarity side, a connection of a pair of power source terminals and a series circuit of the switch portion on the positive polarity side and the switch portion on the negative polarity side, and a connection of an output terminal and a central point of the series circuit of the switch portion on the positive polarity side and the switch portion on the negative polarity side of each arm in the inverter circuit are conducted through a conductive plate member.

* * * * *